(12) United States Patent
Xiu

(10) Patent No.: US 9,036,755 B2
(45) Date of Patent: May 19, 2015

(54) CIRCUITS AND METHODS FOR TIME-AVERAGE FREQUENCY BASED CLOCK DATA RECOVERY

(71) Applicant: Liming Xiu, Plano, TX (US)

(72) Inventor: Liming Xiu, Plano, TX (US)

(73) Assignee: Liming XIU, Plano, TX (US)

( * ) Notice: Subject to any disclaimer, the term of this patent is extended or adjusted under 35 U.S.C. 154(b) by 30 days.

(21) Appl. No.: 13/630,988

(22) Filed: Sep. 28, 2012

(65) Prior Publication Data
US 2014/0093015 A1 Apr. 3, 2014

(51) Int. Cl.
| H04L 7/00 | (2006.01) |
| H03L 7/08 | (2006.01) |
| H04L 7/033 | (2006.01) |
| H03L 7/099 | (2006.01) |
| H03L 7/091 | (2006.01) |

(52) U.S. Cl.
CPC ............ *H03L 7/0807* (2013.01); *H04L 7/0331* (2013.01); *H03L 7/091* (2013.01); *H03L 7/0991* (2013.01)

(58) Field of Classification Search
CPC ......... H03L 7/0995; H03L 7/07; H03L 7/091; H03L 7/0991; H03L 2207/50; H03L 7/087; H03L 7/0891; H03L 2207/06; H03L 7/0807; H03L 7/099; H04L 7/0331; H04L 7/033; H04L 27/1566; H04L 7/0033; H04L 27/227; H04L 27/2272
USPC .......... 375/215, 294, 326, 327, 355, 371, 376
See application file for complete search history.

(56) References Cited

U.S. PATENT DOCUMENTS

| 4,456,890 | A | * | 6/1984 | Carickhoff | .................... 331/1 A |
| 5,057,794 | A | * | 10/1991 | Shih | .............................. 331/1 A |
| 5,239,561 | A | * | 8/1993 | Wong et al. | ................... 375/376 |
| 5,463,351 | A | * | 10/1995 | Marko et al. | .................. 331/1 A |
| 6,329,850 | B1 | | 12/2001 | Mair et al. | |
| 6,438,178 | B1 | * | 8/2002 | Lysdal et al. | .................. 375/317 |
| 6,628,112 | B2 | * | 9/2003 | Pisipaty | ..................... 324/76.53 |
| 6,940,937 | B2 | | 9/2005 | Xiu et al. | |

(Continued)

OTHER PUBLICATIONS

Jun Zhao and Yong-Bin Kim; "A 12-bit Digitally Controlled Oscillator with Low Power Consumption and Low Jitter"; 4 pgs; Department of Electrical and Computer Engineering, Northeastern University, Boston, MA, 2008.

(Continued)

*Primary Examiner* — Emmanuel Bayard
(74) *Attorney, Agent, or Firm* — Andrew D. Fortney; Central California IP Group, P.C.

(57) ABSTRACT

A clock data recovery circuit includes a binary phase detector configured to receive an incoming data signal and a recovered clock, and output a phase offset signal and recovered data; a digital loop control circuit configured to receive the phase offset signal and output a control signal; and a digital frequency generator configured to receive the control signal and output the recovered clock. A method of clock recovery includes generating a digital phase offset signal from incoming data and feedback clock signals; generating a clock frequency control signal from the phase offset signal; generating a recovered clock in response to the control signal; slowing down the recovered clock when the digital phase offset signal has a first binary state; speeding up the recovered clock when the digital phase offset signal has a second binary state; and holding the recovered clock when the digital phase offset signal has a third binary state.

20 Claims, 8 Drawing Sheets

(56) References Cited

U.S. PATENT DOCUMENTS

| | | | |
|---|---|---|---|
| 7,292,662 B2* | 11/2007 | Gregorius | 375/350 |
| 7,409,031 B1* | 8/2008 | Lee et al. | 375/376 |
| 7,599,439 B2* | 10/2009 | Lavelle et al. | 375/240.26 |
| 7,973,691 B2* | 7/2011 | Yamaguchi et al. | 341/155 |
| 8,125,285 B2* | 2/2012 | Titus | 331/177 V |
| 8,311,126 B2* | 11/2012 | Lavelle et al. | 375/240.26 |
| 2003/0107442 A1* | 6/2003 | Staszewski | 331/1 A |
| 2003/0133522 A1* | 7/2003 | Staszewski et al. | 375/345 |
| 2005/0058187 A1* | 3/2005 | Groen et al. | 375/219 |
| 2005/0108600 A1* | 5/2005 | Arguelles | 714/701 |
| 2005/0212566 A1* | 9/2005 | Wilson | 327/105 |
| 2006/0034394 A1* | 2/2006 | Popescu et al. | 375/326 |
| 2006/0076993 A1* | 4/2006 | Teo et al. | 327/165 |
| 2008/0042757 A1* | 2/2008 | Fu et al. | 331/16 |
| 2008/0130816 A1* | 6/2008 | Martin et al. | 375/373 |
| 2008/0298476 A1* | 12/2008 | Bereza et al. | 375/257 |
| 2009/0074125 A1* | 3/2009 | Lin | 375/375 |
| 2009/0086868 A1* | 4/2009 | Shiraishi et al. | 375/359 |
| 2009/0196387 A1* | 8/2009 | McCune, Jr. | 375/355 |
| 2010/0119024 A1* | 5/2010 | Shumarayev et al. | 375/371 |
| 2010/0264963 A1* | 10/2010 | Kikuchi et al. | 327/157 |
| 2010/0289593 A1* | 11/2010 | Chen et al. | 331/177 R |
| 2011/0022890 A1* | 1/2011 | Jeong et al. | 714/15 |
| 2011/0057738 A1* | 3/2011 | Titus | 331/1 A |
| 2011/0075781 A1* | 3/2011 | Kenney | 375/376 |
| 2011/0131439 A1* | 6/2011 | Renner et al. | 713/401 |
| 2011/0182390 A1* | 7/2011 | Lin et al. | 375/371 |
| 2011/0194660 A1* | 8/2011 | Kenney et al. | 375/355 |
| 2011/0261871 A1* | 10/2011 | Staszewski et al. | 375/224 |
| 2011/0267122 A1* | 11/2011 | Jeong et al. | 327/165 |
| 2012/0106689 A1* | 5/2012 | Byun | 375/374 |
| 2012/0314825 A1* | 12/2012 | Dillinger | 375/371 |
| 2013/0216014 A1* | 8/2013 | Kong et al. | 375/376 |
| 2013/0235889 A1* | 9/2013 | Aweya et al. | 370/516 |

OTHER PUBLICATIONS

Vasanth Kakani and Fa Foster Dai; "A 42-4.7GHz, 3.7mW Digitally Controlled Oscillator RFIC"; 2011; pp. 2841-2844; IEEE.

* cited by examiner

| X | Y | Relationship | Action |
|---|---|---|---|
| 0 | 0 | Data no transition | Hold the Rx clk |
| 0 | 1 | Clk is late | Speed up Rx clk |
| 1 | 0 | Clk is early | Slow down Rx clk |
| 1 | 1 | Clk is late | Speed up Rx clk |

CIRCUITS AND METHODS FOR TIME-AVERAGE FREQUENCY BASED CLOCK DATA RECOVERY

FIELD OF THE INVENTION

The present invention generally relates to the field of clock data recovery. More specifically, embodiments of the present invention pertain to circuitry and methods for clock data recovery using a time-average-frequency technique that matches a receiver frequency and a transmitter frequency.

DISCUSSION OF THE BACKGROUND

In wired communications, optical communications, backplane routing, chip-to-chip interconnects, etc., many industry standards have been developed over the years, such as SATA, SONET, PCI Express, IEEE 1394b, USB3.0, HDMI, DVI, DisplayPort, etc. The technological backbone behind these industry standards is Serializer/Deserializer ("SerDes") technology.

FIG. 1 shows a conventional Serializer/Deserializer (SerDes). The Serializer/Deserializer has a pair of functional blocks 10, 20 that convert data 30 from serial to parallel (at deserializer 20) and parallel to serial (at serializer 10). Serializer block 10 generally comprises an input latch 12 and a multiplexor (MUX) 14. The input latch 12 receives a multi-bit incoming data signal 11a-11n, and outputs data signals 13a-13n to the multiplexor 14. The multiplexor receives the data signals 13a-13n, and outputs a serial data stream 30 on differential bus 15 via buffer 16 to the deserializer block 20. Deserializer block 20 generally comprises a demultiplexor (DEMUX) 24 and an output latch 26. The demultiplexer (DEMUX) 24 receives the serial data stream 30 on differential bus 23 via buffer 22, and outputs data signals 25a-25n to the output latch 26. The output latch 26 outputs a multi-bit signal 27a-27n to a downstream processing unit. The benefits of conventional Serializer/Deserializer technology include relatively few wires, smaller board space, longer communication distances, and lower power consumption.

Generally, in most Serializer/Deserializer architectures, the data stream is sent from transmitter to receiver without an accompanying clock signal. The receiver (deserializer 20) first generates a clock signal from an approximate frequency reference. Subsequently, the receiver frequency-aligns and phase-aligns the clock signal to transitions embedded in the data stream 23. This process is commonly known as Clock Data Recovery (CDR), as shown in FIG. 2.

FIG. 2 shows a conventional SerDes architecture in which the receiver 130 includes a clock data recovery (CDR) circuit 140. The SerDes architecture of FIG. 2 comprises a transmitter 110, a board trace 120, and a receiver 130. The transmitter 110 outputs a serial data across the board trace 120 to the receiver 130. The receiver 130 generally comprises a package interface 135 and a clock and data recovery (CDR) circuit 140. The package interface 135 receives the data signal and transmits the data signal to the CDR circuit 140. The CDR circuit 140 outputs the data signal 145 and a recovered clock signal 146.

As illustrated in FIG. 2, the recovered clock 146 has to bear a frequency that matches the incoming data rate. Typically, difficulty occurs due to the incoming data being driven by a clock which is invisible to the CDR circuit 140. The task of the CDR circuit 140 is to find its frequency using the received data. The phase of the recovered clock generally has to be in the center of the data time window (e.g., see clock edges 150, 152, 154 and 156) for maximum safety margin. Furthermore, during the clock generation process, the timing jitter embedded in the incoming data has to be rejected as much as possible. Typically, several issues are addressed in CDR circuit 140, including frequency generation, clock-data alignment, and jitter tolerance.

FIG. 3 illustrates a generic transmitter (TX) 110 and receiver (RX) 130 pair that do not share a common frequency source. Typically, the CDR circuit adjusts the receiver 130 frequency to track the transmitter data rate (e.g., frequency). Generally, the transmitter 110 outputs a data signal 120 to the receiver 130. The receiver 130 receives the data signal 120. However, typically, there is a frequency offset between the transmitter 110 and the receiver 130. For example, the frequency 115 of the transmitter 110 may be $f_0+f_{os}(t)$, and the frequency 132 of the receiver 130 may be $f_0$. Furthermore, the frequency offset may not be stable, and may vary over time.

The transmitter-receiver pair of FIG. 3 illustrates a plesiochronous system, in which the significant instants (e.g., transitions) of the signals occur at nominally the same rate. Any variation of the signals' rate is constrained within a specified limit. For example, in a USB3 system, the transmitter 110 and the receiver 130 operate plesiosynchronously at the same nominal frequency, even though there may be a slight short-term frequency mismatch from time to time. This frequency mismatch leads to phase drifting.

Plesiochronous systems behave similarly to synchronous systems, except that the plesiochronous system must manage synchronization slips, which happen periodically due to the plesiochronous nature of the system. In general, the task of frequency matching between the transmitter 110 and the receiver 130 can be expressed mathematically, as shown in the following equation:

$$P_t = P_r \qquad (1)$$

where $P_t$ is the reciprocal of the frequency of the transmitter 110 and $P_r$ is the reciprocal of the frequency of the receiver 130. The transmitter clock frequency is determined according to the following equation:

$$f_t (=1/P_t) \qquad (2)$$

The receiver clock frequency is determined according to the following equation:

$$f_r (=1/P_r) \qquad (3)$$

If the receiver CDR circuit worked perfectly, Equation (1) above will be satisfied in every data cycle. However, this is never the case, as a practical matter, because feedback is used in the CDR circuit. The compare-then-correct mechanism in feedback implies that it is mathematically impossible to recover the clock within the time frame of one data cycle. Thus, in actual systems, Equation (1) above can never be truly achieved between the transmitter 110 and the receiver 130 if investigated in every data cycle, and instead, Equation (1) is only approximately true in frequency matching cycle by cycle.

In CDR designs, since equation (1) cannot be satisfied on a cycle by cycle basis, the CDR circuit attempts to match frequencies over a relatively long term. Generally, a large (e.g., theoretically infinite) number of frequencies are produced by the CDR circuit in the receiver 130 side, and this large number of frequencies are used to track the transmitter frequency. In other words, the number of possible receiver frequencies "n" is large or infinite. In CDR circuit implementation, there are two approaches, analog CDR and digital CDR. In the analog CDR case, an analog voltage controlled oscillator (VCO) is used as the frequency generator in the CDR structure. This VCO can produce a theoretically infinite number of frequencies that can be used for tracking the transmitter frequency. In the digital CDR case, a digital controlled oscillator (DCO) is used as the frequency generator. A DCO can also produce a large number of frequencies. However, these frequencies are discrete.

FIG. 4 shows a traditional implementation of a clock data recovery (CDR) circuit 140 using a feedback mechanism. A transmitter (not shown) outputs a data signal 141 to a phase detector 142. The phase detector 142 detects the frequency and phase of the data signal 141 from the transmitter, and outputs a retimed data signal 143 and an offset signal to a charge pump 144. The charge pump 144 converts the offset signal into a current signal that can be fed to a loop filter 146. Subsequently, the loop filter 146 smoothes this signal, and outputs an adjustment signal to a voltage controlled oscillator (VCO) 148. The VCO 148 is a frequency generator in the receiver that receives the signal from the filter 146 and outputs a clock signal 149 with corresponding frequency. Furthermore, the VCO 148 outputs the same signal 149 to the phase detector 142 for the frequency and phase comparison between the transmitter data and receiver clock.

CDR circuits typically have a phase detector 142 providing a digital output, but the VCO 148 must receive an analog control signal (e.g., a voltage). Typically, in modern CDR implementations, the phase detector 142 is a binary type circuit rather than a linear type circuit due to the high speed operation of the phase detector 142. Therefore, a digital-to-analog conversion process is required in the forward path (i.e., from the phase detector 142 to the VCO 148). This process results in relatively greater demands for chip resources and power, and an increase in the amount of noise and/or electromagnetic interference (EMI).

Furthermore, the conventional CDR 140 has conflicting constraints in the design of the feedback loop. Filtering uncorrelated input jitter requires a relatively small loop bandwidth. However, suppression of the VCO noise requires a relatively large loop bandwidth.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to circuitry and methods for recovering a clock signal from a received data signal using a time-average-frequency based clock data recovery circuit. The clock data recovery circuit generally comprises (a) a binary phase detector configured to receive (i) an incoming data signal and (ii) a recovered clock signal, and output (iii) a phase offset signal and (iv) recovered data; (b) a digital loop control circuit configured to receive the phase offset signal and output a control signal; and (c) a digital frequency generator configured to (i) receive the control signal and (ii) output the recovered clock signal. The architectures and/or systems generally comprise those that include a clock data recovery circuit embodying one or more of the inventive concepts disclosed herein. The method of recovering a clock signal from an incoming data signal generally comprises (1) generating a multi-bit digital phase offset signal from the incoming data signal and a feedback clock signal; (2) generating a clock frequency control signal from the phase offset signal; (3) generating the recovered clock signal in response to the clock frequency control signal; (4) slowing down the recovered clock signal when the multi-bit digital phase offset signal has a first binary state; (5) speeding up the recovered clock signal when the multi-bit digital phase offset signal has a second binary state; and (6) holding the recovered clock signal when the multi-bit digital phase offset signal has a third binary state.

The present invention advantageously minimizes the number of frequencies generated for the recovered clock signal, and consequently improves the loop response speed and hence improves jitter tolerance. Furthermore, the present invention advantageously eliminates the digital-to-analog conversion process in the clock recovery loop. Thus, the present invention minimizes and/or reduces noise and reduces demands on chip resources and power consumption. As a result, the present invention advantageously improves the performance, reliability, stability, and effectiveness of existing transceivers and networks.

These and other advantages of the present invention will become readily apparent from the detailed description of various embodiments below.

DETAILED DESCRIPTION

Figure 1:
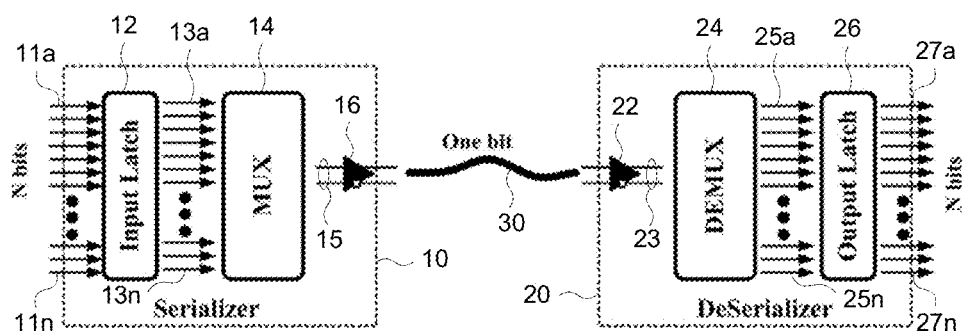
FIG. 1 is a diagram showing a generic Serializer/Deserializer (SerDes) system.
Figure 2:
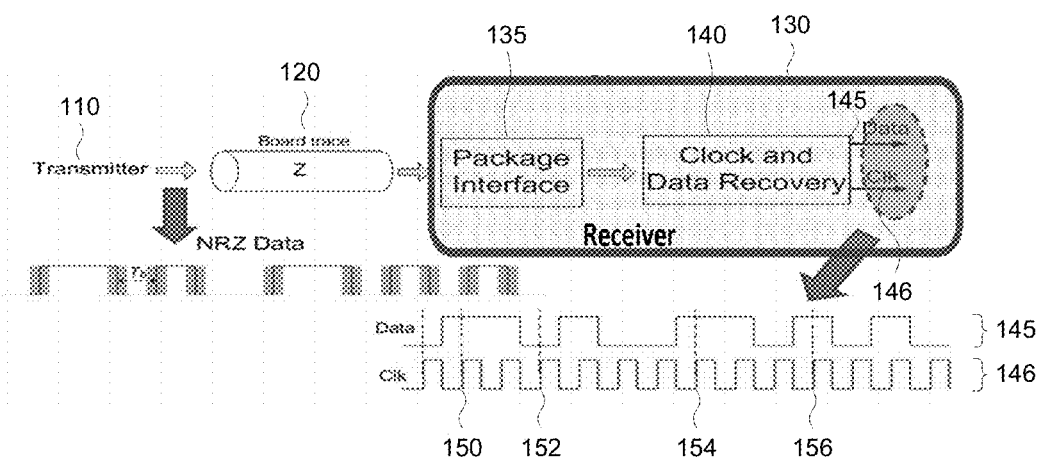
FIG. 2 is a diagram showing a generic clock data recovery circuit.
Figure 3:
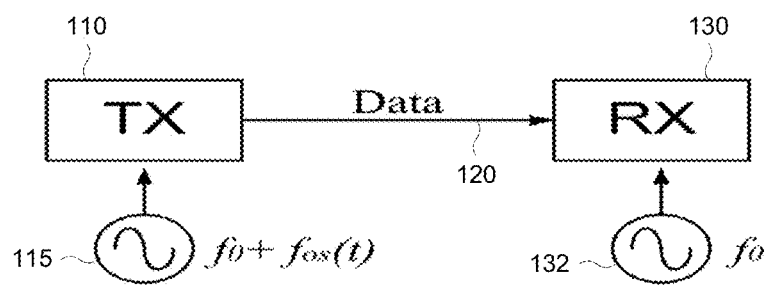
FIG. 3 is a block diagram showing clock frequencies in a generic transmitter and receiver pair.
Figure 4:
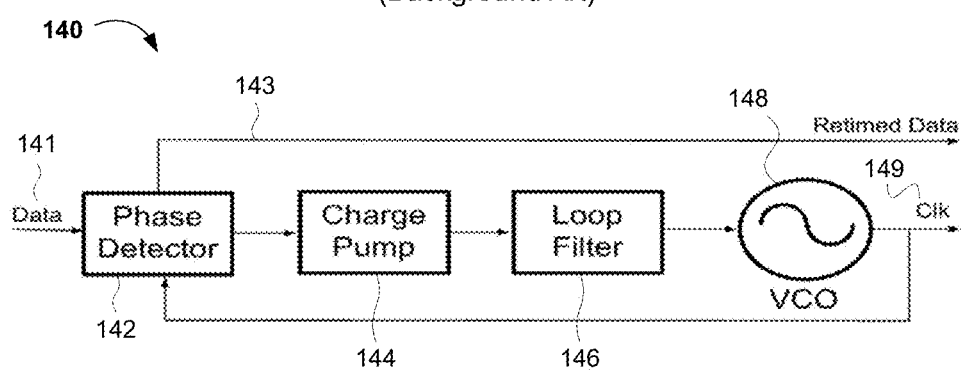
FIG. 4 is a diagram showing a traditional implementation of a clock data recovery loop.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Exemplary Clock Data Recovery Circuit

In one aspect, the present invention concerns a clock data recovery circuit that generally comprises (a) a binary phase detector configured to receive (i) an incoming data signal and (ii) a recovered clock signal, and output (iii) a phase offset signal and (iv) recovered data; (b) a digital loop control circuit configured to receive the phase offset signal and output a control signal; and (c) a digital frequency generator configured to (i) receive the control signal and (ii) output the recovered clock signal.

In the present invention, the task of matching the frequencies between the transmitter and the receiver is achieved by calculating an average frequency over a number of cycles n, as shown in the following equation:

$$P_{ta}(\text{average over } n \text{ cycles}) = a_1 * P_{r1} + a_2 * P_{r2} + a_3 * P_{r3} + \ldots + a_n * P_{rn} \quad (4)$$

Similar to Equation (2) above, the transmitter clock average frequency over n cycles is determined according to the following equation:

$$f_{ta}(=1/P_{ta}) \quad (5)$$

However, the receiver clock frequency is determined according to the following equation:

$$f_{r1}(=1/P_{r1}), f_{r2}, f_{r3}, \ldots f_{rn} \quad (6)$$

wherein $a_1, a_2, a_3, \ldots a_n$ are the probabilities of the respective frequency's occurrence, and $a_1+a_2+a_3+\ldots+a_n=1$. Thus, equation (4) above is achieved in an average sense by taking an average frequency over n cycles (e.g., over several cycles).

Equation (1) above requires the matching of frequencies in every cycle. The frequency matching in Equation (4) of the present invention can be accomplished over several cycles. The following discussion explains how the exemplary circuitry shown in the figures accomplishes this result. However, it will be clear from the following discussion that alternative and/or equivalent circuitry can provide the same result.

Figure 5:
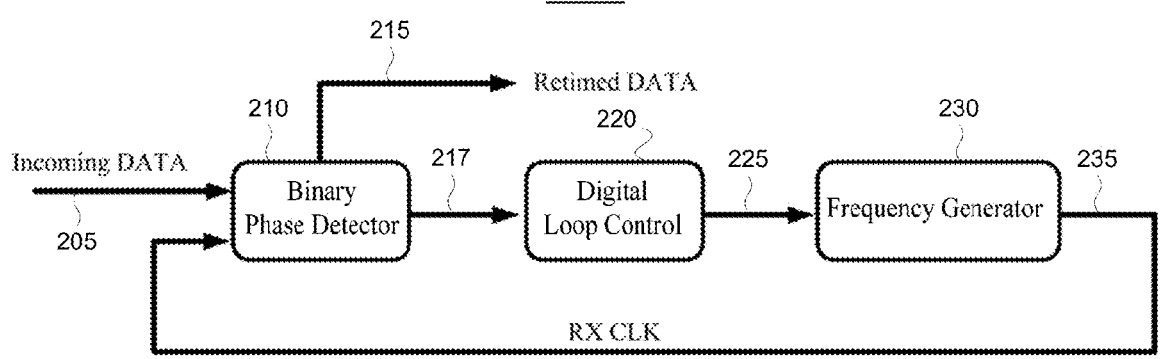
FIG. 5 is a diagram showing an exemplary Time-Average-Frequency based clock data recovery circuit of the present invention.

Referring to FIG. 5, an exemplary Time-Average-Frequency (TAF)-based clock data recovery (TAF-CDR) circuit comprises a binary phase detector 210, a digital loop control 220, and a frequency generator 230. The binary phase detector 210 receives an incoming data signal 205 from a remote transmitter (not shown) and a recovered clock signal RX CLK 235. In addition, the binary phase detector 210 outputs a phase offset signal 217 and received and/or retimed data 215. The digital loop control circuit 220 is configured to receive the phase offset signal 217 (which may be a multi-bit digital signal and which may also be a phase/frequency offset signal) from the binary phase detector 210. The digital loop control circuit 220 outputs a control signal 225 in response to the phase or phase/frequency offset signal 217. Subsequently, the digital frequency generator 230 is configured to receive the control signal 225 and output the recovered clock signal 235. In the exemplary TAF-CDR circuit of FIG. 5, the phase detector output is digital, and the DCO input is digital. Thus, the feedback loop is also digital (e.g., all the control variables in the loop are digital). As a result, the digital-to-analog conversion process in the clock recovery loop is eliminated.

In various embodiments of the present invention, the digital frequency generator 230 comprises a digitally controlled oscillator (DCO). In one embodiment, the DCO comprises a time-average-frequency clock data recovery (TAF-CDR) circuit. A recovered clock signal 235 having one of a plurality of predetermined frequencies is generated by the frequency generator. The recovered clock signal 235 may have different frequencies at different times or during different clock cycles.

In this embodiment, a predetermined number of discrete frequencies are utilized in the receiver for the recovered clock signal 235. The recovered clock signal 235 has one of at least two frequencies, in which the recovered clock signal 235 has a first frequency when the control signal 225 speeds up the recovered clock signal 235, and a second frequency when the control signal 225 slows down the recovered clock signal 235. The control signal 225 is generally a digital signal that controls or adjusts a frequency of the recovered clock signal 235.

In an exemplary embodiment of the present invention, the DCO 230 can produce a clock signal having one of three (3) discrete frequencies (e.g., $f_1$, $f_2$, and $f_3$) in each data/clock cycle. Producing a clock signal that can have one of only a relatively low number of frequencies (e.g., three frequencies) advantageously minimizes cost, power and response time, and improves reliability and/or performance robustness, compared to the voltage controlled oscillator (VCO) of conventional clock data recovery circuits.

Figure 6:
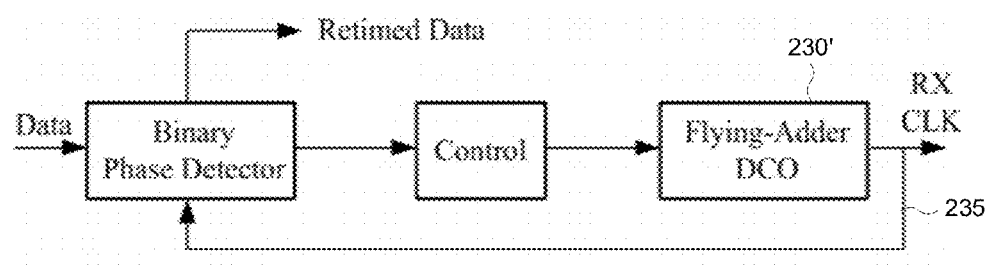
FIG. 6 is a diagram showing an exemplary circuit for the Time-Average-Frequency based clock data recovery circuit of the present invention having a flying-adder based digitally controlled oscillator (DCO).

FIG. 6 shows another exemplary circuit for Time-Average-Frequency clock data recovery (TAF-CDR), in which the frequency generator (e.g., 230 of FIG. 5) is a flying-adder based digitally controlled oscillator (DCO) 230'. However, other types of digitally controlled oscillators may be utilized. The flying-adder DCO circuit 230' is configured to produce the recovered clock signal 235 at one of the plurality of predetermined frequencies, as previously discussed. In the present TAF-CDR, the frequency generator (e.g., the flying-adder DCO 230') has the capability of producing a clock signal having one of a plurality of discrete frequencies relatively quicker than conventional frequency generators.

Figure 7A:
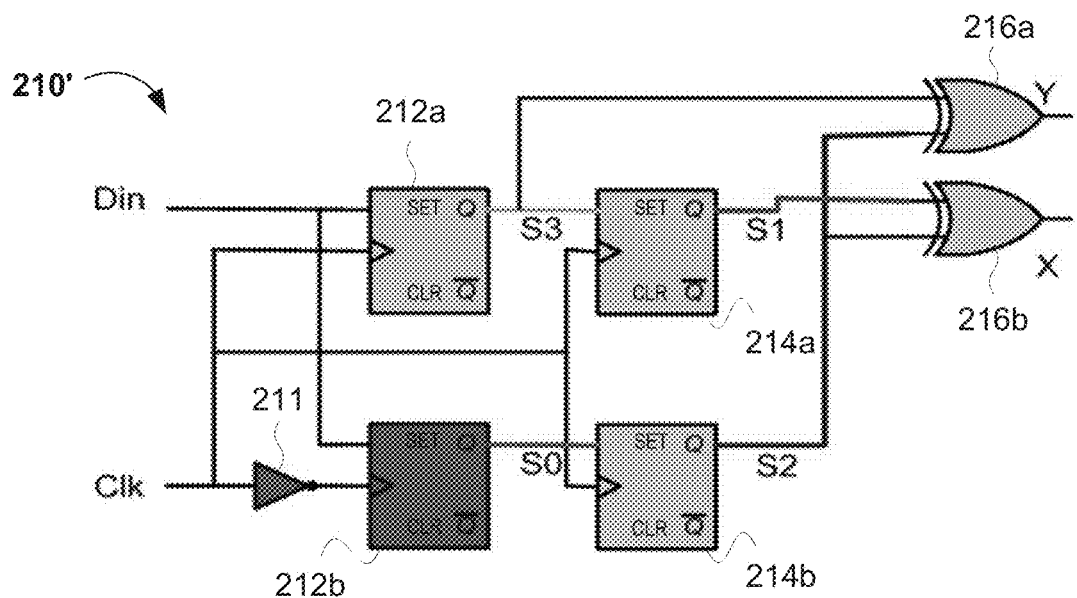
FIG. 7A is a diagram showing an exemplary phase detector circuit for the Time-Average-Frequency based clock data recovery circuit of the present invention.

FIG. 7A is a diagram showing an exemplary phase detector circuit 210' for the Time-Average-Frequency based clock data recovery circuit of FIGS. 5-6. The binary phase detector 210' comprises a plurality of flip flops 212a, 212b, 214a, and 214b configured to receive the incoming data signal (Din) and the recovered clock signal (Clk), either directly (flip flops 212a, 214a and 214b) or via an inverter 211 (flip flop 212b). Furthermore, the binary phase detector comprises output logic 216a, 216b configured to output the phase offset signal 217 (FIG. 5). The output from the phase detector 210' may comprise a multi-bit digital signal (e.g., 2-bit signal X, Y). The multi-bit signal represents the output from the phase detector 210' that is configured to instruct the followed loop control block. Output logic unit 216a outputs signal Y as S2 XOR S3 and output logic unit 216b outputs signal X as S1 XOR S2. However, any logic unit (e.g., OR, NOR, XNOR, AND, NAND, etc.) or combination of logic units capable of outputting (i) a single-bit output signal that speeds up the recovered clock signal when it is late and that slows down the recovered clock signal when it is early or (ii) a multi-bit output signal that speeds up the recovered clock signal when it is late, slows down the recovered clock signal when it is early, and holds the recovered clock signal when there is no data transition (see, e.g., FIG. 8) are suitable for use in the present invention.

The phase detector of FIG. 7A uses a digital logic approach to differentiate the three relationships between the recovered clock signal (Clk) and incoming data signal (Din): (i) the recovered clock is early relative to the incoming data signal; (ii) the recovered clock is late relative to the incoming data; and (iii) there are no data transitions during two or more successive transitions of the recovered clock signal. The phase detector 210' effectively uses the recovered clock to strobe the incoming data waveform at multiple points, and the result is used to make the early or late decision (three-point sampling; see, e.g., J. D. H. Alexander, IEE J. Electronics Letters, pp. 541-542, 1975). The four flip-flops 212a, 212b, 214a, and 214b as shown in FIG. 7A are utilized to achieve the three-point sampling.

Figure 7B:
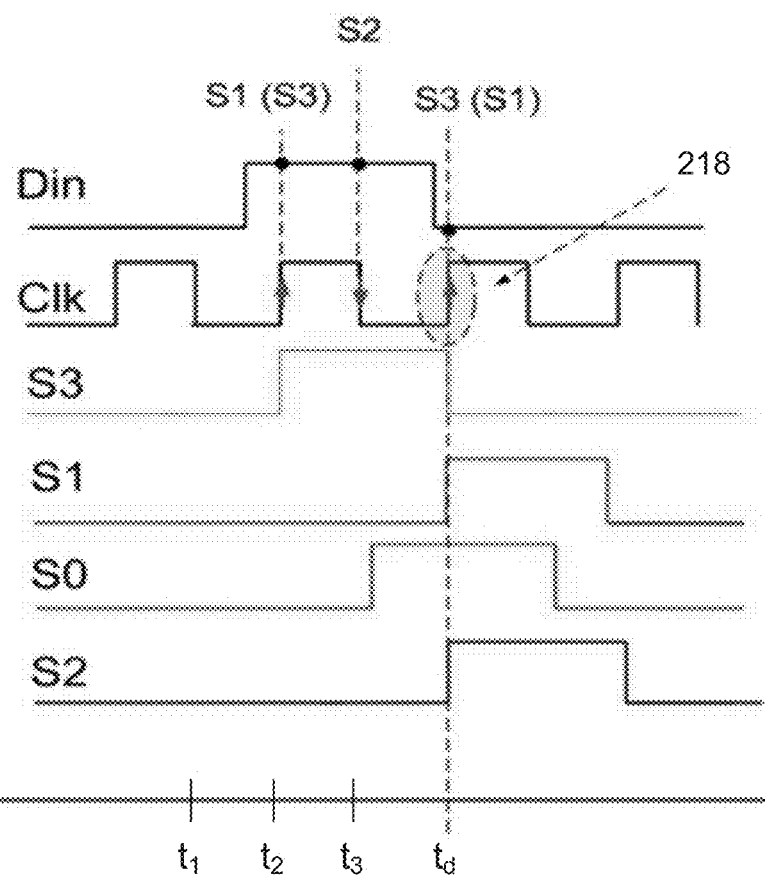
FIG. 7B is a diagram showing exemplary waveforms showing the operation of the phase detector of FIG. 7A.

FIG. 7B is a diagram of the waveforms at nodes S0-S3, showing an example of how the flip-flops 212a, 212b, 214a, and 214b in the phase detector 210' of FIG. 7A achieve three-point sampling. In this example, the clock is later than the data signal. At time $t_1$, Din transitions from 0 to 1, then shortly thereafter at $t_2$, Clk transitions from 0 to 1 (i.e., the clock's first rising edge). This causes S3 to change state from 0 to 1. At $t_3$, the recovered clock signal Clk transitions from 1 to 0 (i.e., the clock's falling edge), which results in S0 transitioning from 0 to 1. Then, at time $t_d$, a second clock rising edge 218 does three things, including moving S3 to the current time $t_d$ (S3 becomes S1 now), moving S2 to the current time $t_d$ (S0 becomes S2 now), and taking a new sample S3 at the current time $t_d$. At the current time $t_d$, S1, S2, and S3 are valid simultaneously. Thus, a decision on the clock-data relationship can be effectively and efficiently made.

Referring back to FIG. 7A, the logic equations from XOR gates 216a and 216b are X=S1 XOR S2 and Y=S2 XOR S3, respectively. Therefore, based on the three-point sampling values of S1, S2 and S3, for the case of clock-later-than-data, the corresponding results are X=0 and Y=1. Similarly, for the case of clock-earlier-than-data, the results will be X=1 and Y=0. When the data does not transition, the results are X=0 and Y=0. This three-point sampling mechanism is applied in every data cycle. Therefore, this type of decision regarding the clock-data relationship can be made in every cycle. The time between $t_1$ and $t_d$ in FIG. 7B is one data cycle, the clock having two transitions per data cycle. In other words, there is one low level and one high level for the clock, but only one level for the data (which is high in this case).

Figures 8, 9:
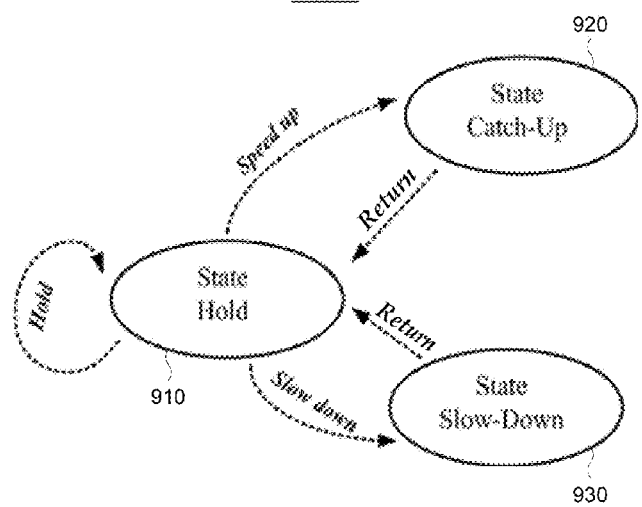
FIG. 8 is a truth table for an exemplary loop control mechanism in the Time-Average-Frequency based clock data recovery circuit of FIGS. 5-6.
FIG. 9 is a state machine illustrating a "one-step-forward" clock adjustment mechanism for the circuit of FIGS. 5-6.

FIG. 8 illustrates a truth table showing an exemplary loop control mechanism of the Time-Average-Frequency based clock data recovery circuit of FIG. 5. As described above, the phase offset signal comprises a multi-bit digital signal. When the multi-bit digital signal has a first binary state (e.g., 00), the control signal holds the recovered clock signal. If the multi-bit digital signal has a second binary state (e.g., 01 or 11), the control signal speeds up the recovered clock signal. Furthermore, if the multi-bit digital signal has a third binary state (e.g., 10), the control signal slows down the recovered clock signal. Alternative output logic can output a similar multi-bit digital phase offset signal accomplishing the same results, but optionally using different states. In the case of a single-bit digital phase offset signal, a first state of the phase offset signal can instruct the loop control circuit (e.g., 220 in FIG. 5) to speed up the recovered clock signal and the second state of the phase offset signal can instruct the loop control circuit to slow down the recovered clock signal. It is well within the skill level of one skilled in the art to design logic capable of outputting such a single-bit phase offset signal using the relative arrival times of the incoming data signal and the recovered clock signal.

Referring to FIG. 9, a state machine showing a "one-step-forward" implementation of the circuitry of FIGS. 5-8 is illustrated. The "hold" state 910, which may be referred to as the default state, corresponds to a target, default or sustainable level frequency ($f_{hold}$; or "State Hold"). In the "hold" state 910, the recovered clock signal has a frequency (e.g., $F_2$) between the frequencies of the adjacent states 920 and 930, and typically, there is a known mathematical relationship between the three frequencies. When the control circuit instructs the DCO to speed up, the DCO enters the "catch-up" state 920. In the "catch-up" state 920, the recovered clock signal has a frequency (e.g., $F_1$) greater than the frequencies of the other two states 910 and 930. When the control circuit instructs the DCO to slow down from the "catch-up" state 920, the DCO returns to the "hold" state 910 and the frequency of the recovered clock signal returns to the default state ($F_2$). If the control circuit instructs the DCO to slow down from the "hold" state 910, the DCO enters the "slow down" state 920. In "State Slow-Down" 930, the recovered clock signal has a frequency (e.g., $F_3$) less than the frequencies of the other two states 910 and 920. When the control circuit instructs the DCO to speed up from the "slow-down" state 930, the DCO returns to the default ("hold") state 910.

In one implementation, the recovered clock signal has a frequency of 2.5 GHz (i.e., a period=400 ps) in "State Hold" 910, has a frequency of 2.67 GHz (i.e., a period of 375 ps) in "State Catch-Up" 920, and a frequency of 2.35 GHz (i.e., a period of 425 ps) in "State Slow-Down" 930. Thus, the mathematical relationship between the frequencies of the recovered clock signal in the three states may be $F_1=1/(P_2-x)$, $F_2=1/P_2$, and $F_3=1/(P_2+x)$, where $P_2$ is the period of the recovered clock signal in "State Hold" 910, and x is a predetermined amount of time, although other mathematical relationships may be suitable.

Thus, referring back to FIG. 5, the DCO 230 may produce a clock signal having one of three frequencies, based on the output 225 of digital loop control circuit 220. The three frequencies include a first, low level frequency ($f_{low}$, or slow-down state 930) for slowing down the recovered clock, a second, sustainable level frequency ($f_{hold}$, or hold state 910) for staying or holding the recovered clock at its current (or target) speed, and a third, high level frequency ($f_{high}$, or catch-up state 920) for speeding up the recovered clock. In a two-state system, the binary recovered clock signal has two distinguishing levels, a high level corresponding to catch-up state 920, and a low level corresponding to slow-down state 930. Thus, if the clock is behind, then the state machine speeds up the receiver clock. If the clock is ahead, then the state machine slows down the recovered clock. If cannot be determined that the recovered clock is behind or ahead (e.g., there are no data transitions), then the state machine holds the recovered clock at the current speed (e.g., regardless of whether it is low, high, or in the middle).

Figure 10:
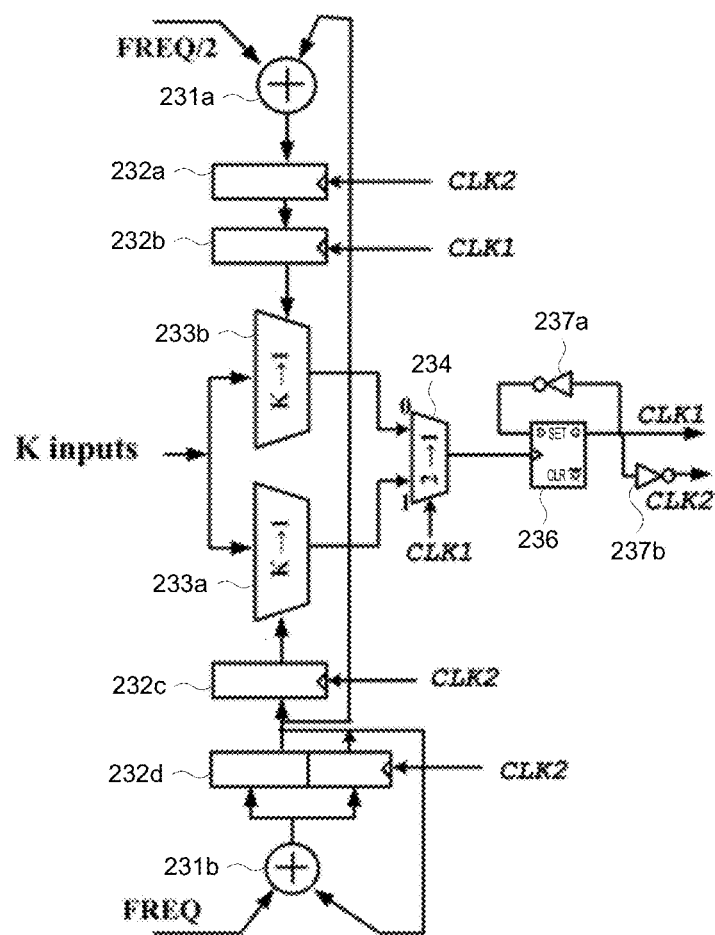
FIG. 10 is a diagram showing an exemplary flying-adder digitally controlled oscillator circuit for the present clock data recovery circuit.

FIG. 10 is a diagram showing an exemplary flying-adder digitally controlled oscillator circuit suitable for clock data recovery in the present invention. The K inputs applied to the inputs of multiplexers 233a, 233b are a group of reference signals (e.g., directly or indirectly from a crystal oscillator, a system [e.g., off-chip] clock, conventional voltage controlled oscillator [on-chip or off-chip], etc.). The K inputs are reference signals for the flying-adder DCO and can be generated in any of a variety of ways (see, e.g., Xiu, Liming, *Nanometer Frequency Synthesis Beyond the Phase-Locked Loop*, Section 4.2.3, IEEE Press Server on Microelectronic Systems, John Wiley & Sons, September 2012). In one embodiment, multiplexers 233a, 233b are 32-to-1 multiplexers for selecting an input according to the digital value applied by registers 232b, 232c, respectively. The outputs of multiplexers 233a, 233b are connected to two-to-one multiplexer 234, which selects between the outputs of multiplexers 233a, 233b, in response to clock signal CLK1 (see the Q output of D-type flip-flop 236). The output of D-type flip-flop 236 is also connected via inverter 237a to the clock input of D-type flip-flop 236, which causes CLK1 to toggle in periodic fashion. D-type flip-flop 236 drives clock signal CLK1 from its Q output and clock signal CLK2 via inverter 237b.

The phase selection by multiplexers 233a, 233b is effected by two adder legs. The first (lower) adder leg includes adder or accumulator 231b, which adds the value of the frequency control word FREQ (which may be 32 bits wide, and/or which may contain fractional bit values) with the value from register 232d (which may be 32 bits wide). The frequency control word FREQ may control the output frequency and may be provided by the user. Register 232d is the register receiving (and storing on an edge [e.g., the rising edge] of the clock signal CLK2) the sum generated by adder 231b. The most significant bits of register 232d (e.g., the 5 most significant bits) may transferred to register 232c and accumulated by adder 231b when FREQ consists of an integer number of bits; otherwise adder/accumulator 231b receives and accumulates a greater number of bits from register 232d. The value in register 232d (or the most significant bits thereof) is stored in register 232c on the next rising edge of output clock CLK2, and then applied to the select input(s) of multiplexer 233a.

The second (upper) adder leg of the flying adder circuit (e.g., flying-adder synthesizer 230' of FIG. 6) includes adder 231a, which receives a digital signal FREQ/2 at one input, and the contents of register 232d (or the most significant bits thereof) at its second input. Signal FREQ/2 is, in one implementation, the signal FREQ divided by 2, to provide a 50% duty cycle at the output(s) of flying adder DCO 230'. Adder 231a sums these two values, and stores the sum in register 232a on a (rising) edge of output clock signal CLK2, and is clocked into register 232b on the next rising edge of output clock signal CLK1. The output of register 232b is presented to the select input(s) of multiplexer 233b.

Multiplexer 234 is controlled by output clock signal CLK1, so that the output of multiplexer 233a is forwarded to the clock input of flip-flop 236 responsive to output clock signal CLK1 being high ("1") and so that the output of multiplexer 233b is forwarded responsive to output clock signal CLK1 being low ("0"). Clock signals CLK1, CLK2 are produced by flip-flop 236 as described above. Of course, it will be clear from the discussion herein that alternative and/or equivalent circuitry can provide the same or functionally similar results.

The flying-adder DCO described above has a frequency transfer function which is mathematically describable (see, e.g., Xiu, Liming, *Nanometer Frequency Synthesis Beyond the Phase-Locked Loop*, Section 4.5, IEEE Press Server on Microelectronic Systems, John Wiley & Sons, September 2012). For every value of frequency control word FREQ, there is one and only one corresponding output frequency. Referring back to FIG. 5, the output from the phase detector 210 is fed to the digital loop control block 220. The digital loop control block 220 will map the "Action" in FIG. 8 to the appropriate FREQ value. As a result, the frequency generator 230 will produce the adequate frequency for the recovered clock signal 235 to track the incoming DATA.

Figure 11:
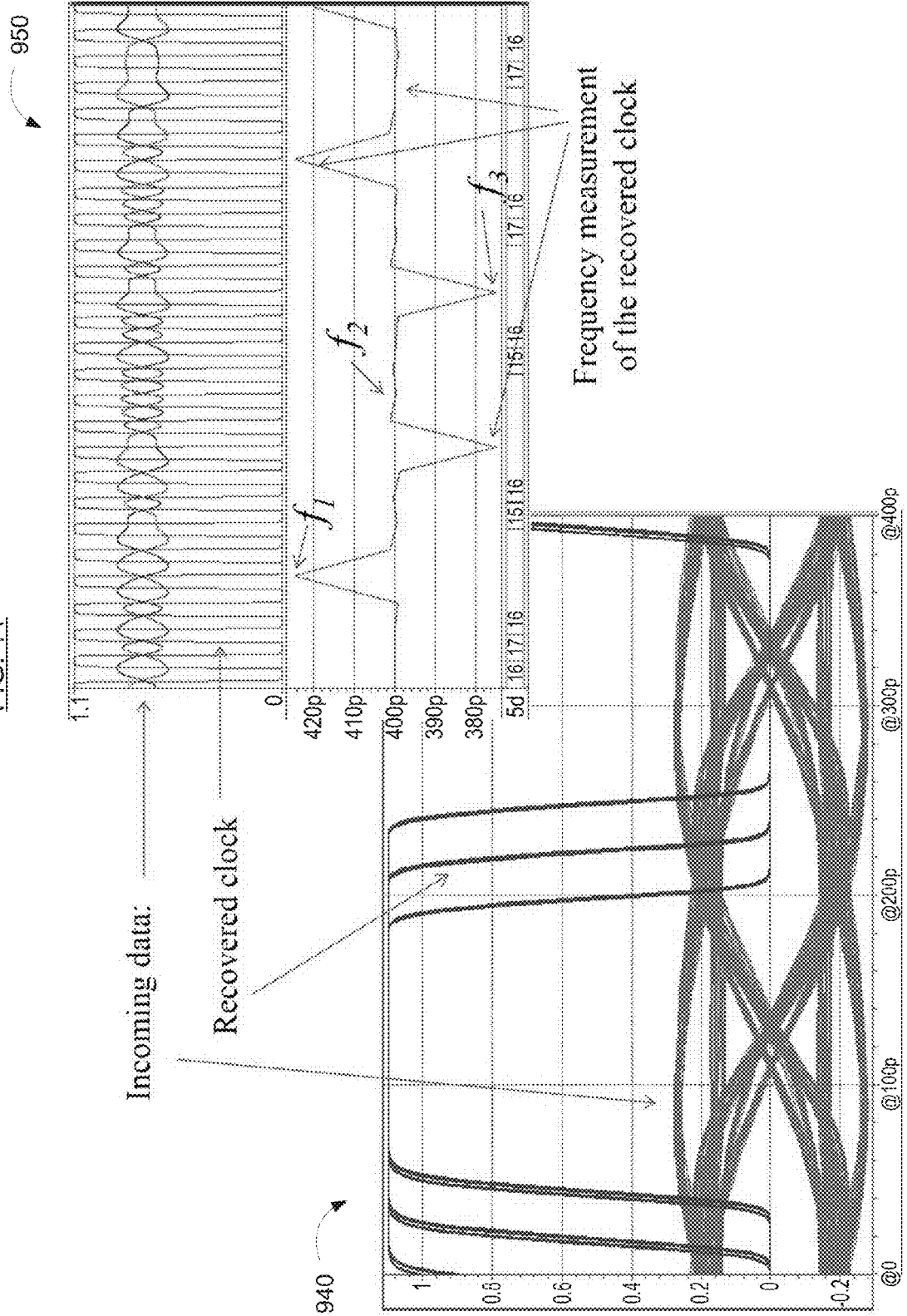
FIG. 11 shows waveforms and an eye diagram from a simulation using an exemplary clock data recovery circuit consistent with the circuitry of FIGS. 5-7A, 8 and 10.

FIG. 11 shows waveforms and an eye diagram illustrating simulated data received and clock frequency measurements recovered by the exemplary TAF-CDR circuit of FIG. 6. Lower graph 940 is a classic "eye" diagram that shows the date and clock relative positions. The bottom traces are data of many cycles overlaid on each other displayed in one cycle. The top traces are clock signal of many cycles overlaid on each other. In upper graph 950, the differential waveform for the incoming data and the recovered clock signal are shown at the top, and the frequencies $f_1$, $f_2$ and $f_3$ (or, more accurately, the corresponding periods, as shown by the picosecond time units along the abscissa or y-axis) of the recovered clock at corresponding times are shown at the bottom. The row of numbers at the very bottom of graph 950 (including boxes containing the numbers 15, 16 and 17) indicate states of the control loop (see the state machine of FIG. 9). State 16 is the default state (recovered clock period=400 ps), state 17 is the "slow-down" state (recovered clock period=425 ps), and state 15 is the "catch-up" state (recovered clock period=375 ps). Note the approximately 3-cycle delay between the change of state and the change in the period of the recovered clock signal.

Figure 12:
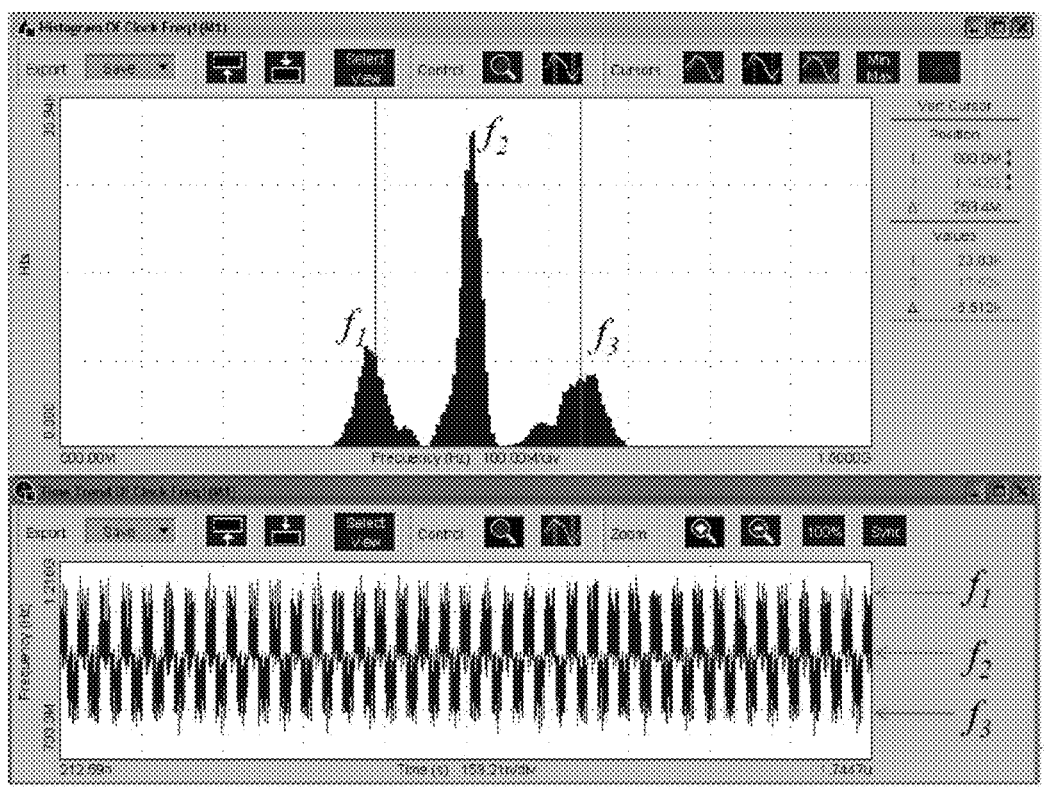
FIG. 12 is a histogram illustrating measured data (e.g., various clock frequencies) of an exemplary Time-Average-Frequency based clock data recovery circuit according to the present invention.

FIG. 12 includes a histogram illustrating the frequencies of clock signal 235 (FIG. 5) measured for an exemplary Time-Average-Frequency based clock data recovery circuit according to the present invention. In the top plot, the X-axis is the frequency from 500 MHz to 1.5 GHz. The Y-axis is the number of hits for each frequency (e.g., a histogram). There are three groups of frequencies that are centered around 889 MHz, 1 GHz, and 1.14 GHz, respectively. Ideally, there are three discrete frequencies produced by the present TAF-CDR circuit: 889 MHz, 1 GHz, and 1.14 GHz. Due to various noise sources, each of the 3 discrete frequencies may become a frequency group or distribution in actual practice.

The bottom plot of FIG. 12 includes a snapshot of the frequency-vs.-time trend, in which there are three frequencies: 889 MHz ($f_3$), 1 GHz ($f_2$) and 1.14 GHz ($f_1$). The X-axis is the time window from 212.59 ns to 1.7447 µs, and the Y-axis is the frequency measured.

Exemplary Methods of Recovering a Clock Signal from an Incoming Data Signal

The present invention further relates to methods of recovering a clock signal from an incoming data signal. The method generally comprises (1) generating a multi-bit digital phase offset signal from the incoming data signal and a feedback clock signal; (2) generating a clock frequency control signal from the phase offset signal; (3) generating the recovered clock signal in response to the clock frequency control signal; (4) slowing down the recovered clock signal when the multi-bit digital phase offset signal has a first binary state; and (5) speeding up the recovered clock signal when the multi-bit digital phase offset signal has a second binary state. In some embodiments of the present invention, the clock frequency control signal holds the frequency of the recovered clock signal when the multi-bit digital phase offset signal has a third binary state.

In further embodiments of the present invention, the recovered clock signal has one of a plurality of predetermined target frequencies. The recovered clock signal has a first one of the plurality of predetermined target frequencies when the multi-bit digital phase offset signal speeds up the recovered clock signal, and a second one of the plurality of predetermined target frequencies when the multi-bit digital phase offset signal slows down the received clock signal. In further embodiments, the recovered clock signal has the first target frequency, the second target frequency, or a third one of the plurality of predetermined target frequencies between the first and second target frequencies when the digital phase offset signal holds the recovered clock signal (or the target frequency thereof).

In an exemplary embodiment of the present invention, the recovered clock signal is generated by a digitally controlled oscillator. In one embodiment, the digitally controlled oscillator may comprise a flying-adder circuit.

The present TAF-CDR does not match the receiver frequency with the transmitter frequency in every individual clock cycle. However, matching of transmitter and receiver frequencies are accomplished in an average sense over several clock cycles and/or intervals. In other words, within several clock cycles, the transmitter and receiver average frequency rates are matched. Although the transmitter and receiver frequencies might not be matched at each individual cycle, the present TAF-CDR matching is accomplished in such a way that the transmitted data (e.g., TX data) can be safely received by the receiver in every cycle because the timing margin is safely controlled.

The present CDR loop and clock recovery method advantageously (i) lower or minimize costs compared to conventional clock data recovery circuits; (ii) lower power by reducing the amount and/or number of resources required (e.g., for implementation); (iii) provide a faster response by using fewer frequencies and a simpler feedback loop; and (iv) provide a more robust performance by eliminating digital-to-analog conversion process. Prior to the present TAF-DCO circuit, conventional CDR circuits generally did not implement such fast-response DCO's (e.g., a flying-adder DCO).

The present TAF-CDR circuit and method advantageously adjust the receiver frequency to track the transmitter data rate (frequency), thus advantageously matching the transmitter and receiver frequencies. In matching and/or adjusting the receiver clock frequency to the transmitter data rate and/or clock frequency, the present invention utilizes a Time-Average-Frequency in the receiver CDR circuit to match the transmitter frequency by calculating an average frequency over a number of cycles n, rather than match the transmitter and receiver frequencies in every cycle as is generally done (or at least attempted) in conventional CDR's.

CONCLUSION/SUMMARY

Thus, the present invention provides circuitry and methods for matching a transmitter frequency and a receiver frequency using a time-average-frequency based clock data recovery approach. The present circuit and method greatly improve the stability, reliability and effectiveness of receivers, transceivers, and data communication networks using serial transmission lines. The present CDR circuit and/or method also advantageously (i) lowers cost; (ii) lowers power by reducing the amount of resource required; (iii) provides a faster response by using fewer frequencies and a simpler loop; and (iv) provides a more robust performance by eliminating the digital/analog conversions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A clock data recovery circuit, comprising:
   a binary phase detector configured to receive (i) an incoming data signal and (ii) a recovered clock signal, and output (iii) a multi-bit digital phase offset signal and (iv) recovered data;
   a digital loop control circuit configured to receive said multi-bit digital phase offset signal and output a digital control signal in every cycle of said incoming data signal in response to the multi-bit digital phase offset signal; and
   a digital frequency generator configured to (i) receive said digital control signal and (ii) output said recovered clock signal at a time-average-frequency of a predetermined number of discrete frequencies controlled or adjusted by said digital control signal, wherein:
      when said multi-bit digital signal has a first binary state, said digital control signal instructs said digital frequency generator to output a first one of said discrete frequencies as said recovered clock signal, said first one of said discrete frequencies being less than said time-average-frequency; and when said multi-bit digital signal has a second binary state, said digital control signal instructs said digital frequency generator to output a second one of said discrete frequencies as said recovered clock signal, said second one of said discrete frequencies being greater than said time-average-frequency.

2. The clock data recovery circuit of claim 1, wherein said binary phase detector comprises (i) a plurality of flip flops configured to receive said incoming data signal and said recovered clock signal, and (ii) output logic configured to output said multi-bit digital phase offset signal.

3. The clock data recovery circuit of claim 1, wherein when:

said multi-bit digital signal has a third binary state, said digital control signal instructs said digital frequency generator to output a third one of said discrete frequencies as said recovered clock signal, said third one of said discrete frequencies being between said first and second ones of said discrete frequencies.

4. The clock data recovery circuit of claim 1, wherein said digital frequency generator outputs said first one of said discrete frequencies when said digital control signal corresponds to a transition of said recovered clock signal being earlier than a transition of said incoming data signal, and said digital frequency generator outputs said second one of said discrete frequencies when said digital control signal corresponds to said transition of said recovered clock signal being later than a transition of said incoming data signal.

5. The clock data recovery circuit of claim 1, wherein said digital frequency generator comprises a time-average-frequency based direct period synthesis (TAF-DPS) circuit.

6. The clock data recovery circuit of claim 1, wherein said recovered clock signal comprises a digital signal.

7. The clock data recovery circuit of claim 1, wherein said digital loop control circuit implements a state machine that:

increases a frequency of said recovered clock signal when said multi-bit digital signal has said first binary state;

decreases a frequency of said recovered clock signal when said multi-bit digital signal has said second binary state; and holds said recovered clock signal at a frequency when said multi-bit digital signal has a third binary state.

8. The clock data recovery circuit of claim 1, wherein said digital frequency generator comprises a flying adder circuit.

9. The clock data recovery circuit of claim 1, wherein said predetermined number of discrete frequencies is 2 or 3.

10. The clock data recovery circuit of claim 3, wherein said first, second and third ones of said discrete frequencies have respective frequencies of $F_1=1/(P-x)$, $F_2=1/(P+x)$, and $F_3=1/P$, where $F_1$, $F_2$ and $F_3$ are the first, second and third ones of said discrete frequencies, respectively, P is a period of the third one of said discrete frequencies, and x is a predetermined amount of time.

11. The clock data recovery circuit of claim 1, wherein said binary phase detector determines a value of the multi-bit digital phase offset signal in every cycle of said incoming data signal.

12. The clock data recovery circuit of claim 1, wherein said digital loop control circuit outputs said digital control signal in every cycle of said incoming data signal.

13. A method of recovering a clock signal and a data signal from an incoming data signal, comprising:

generating a multi-bit digital phase offset signal and outputting a received and/or retimed data signal from the incoming data signal and a feedback signal;

generating a digital clock frequency control signal in every cycle of said incoming data signal from said multi-bit phase offset signal;

generating said recovered clock signal from a digital frequency generator at a time-average-frequency of a predetermined number of discrete frequencies in response to said digital clock frequency control signal, wherein said digital clock frequency control signal:

instructs said digital frequency generator to output a first frequency of said discrete frequencies as said recovered clock signal when said multi-bit digital phase offset signal has a first binary state, said first frequency being less than said time-average-frequency; and instructs said digital frequency generator to output a second frequency of said discrete frequencies as said recovered clock signal when said multi-bit digital phase offset signal has a second binary state, said first frequency being greater than said time-average-frequency.

14. The method of claim 13, wherein said digital clock frequency control signal instructs said digital frequency generator to output a third one of said discrete frequencies as said recovered clock signal when said multi-bit digital phase offset signal has a third binary state, said third one of said discrete frequencies being between said first and second ones of said discrete frequencies.

15. The method of claim 13, wherein said digital frequency generator outputs said first frequency of said predetermined number of discrete frequencies when said digital control signal corresponds to a transition of said recovered clock signal being earlier than a transition of said incoming data signal, and said digital frequency generator outputs said second frequency of said predetermined number of discrete frequencies when said digital control signal corresponds to said transition of said recovered clock signal being later than a transition of said incoming data signal.

16. The method of claim 15, wherein said recovered clock signal has a third frequency of said predetermined number of discrete frequencies between said first and second frequencies when said incoming data signal does not have a transition.

17. The method of claim 13, wherein said recovered clock signal is generated by a digitally controlled frequency synthesizer.

18. The method of claim 17, wherein said digitally controlled frequency synthesizer comprises a time-average-frequency based direct period synthesis circuit.

19. The method of claim 13, wherein said predetermined number of discrete frequencies is 2 or 3.

20. The method of claim 19, wherein said first, second and third ones of said discrete frequencies have respective frequencies of $F_1=1/(P-x)$, $F_2=1/(P+x)$, and $F_3=1/P$, where $F_1$, $F_2$ and $F_3$ are the first, second and third ones of said discrete frequencies, respectively, P is a period of the third one of said discrete frequencies, and x is a predetermined amount of time.

* * * * *